United States Patent
Weibel et al.

(10) Patent No.: US 10,997,341 B1
(45) Date of Patent: May 4, 2021

(54) SYSTEM EDITING PLUGIN

(71) Applicant: salesforce.com, inc., San Francisco, CA (US)

(72) Inventors: Alan Weibel, San Francisco, CA (US); Abigail Sigler, Oswego, OR (US); John Ryan Reimer Earle, San Francisco, CA (US)

(73) Assignee: salesforce.com, inc., San Francisco, CA (US)

( * ) Notice: Subject to any disclaimer, the term of this patent is extended or adjusted under 35 U.S.C. 154(b) by 0 days.

(21) Appl. No.: 16/711,956

(22) Filed: Dec. 12, 2019

(51) Int. Cl.
| | | |
|---|---|---|
| *G06F 30/33* | (2020.01) | |
| *G06F 9/54* | (2006.01) | |
| *G06F 16/95* | (2019.01) | |
| *G06F 30/3323* | (2020.01) | |
| *G06F 16/955* | (2019.01) | |

(52) U.S. Cl.
CPC .......... *G06F 30/3323* (2020.01); *G06F 9/54* (2013.01); *G06F 16/9558* (2019.01)

(58) Field of Classification Search
CPC ..... G06F 30/3323; G06F 16/9558; G06F 9/54
USPC ................................................ 716/100, 110
See application file for complete search history.

(56) References Cited

U.S. PATENT DOCUMENTS

| | | | |
|---|---|---|---|
| 6,289,382 B1* | 9/2001 | Bowman-Annuah | ........................ G06F 13/387 709/226 |
| 6,438,594 B1* | 8/2002 | Bowman-Annuah | ........................ G06F 9/4488 709/225 |
| 6,477,580 B1* | 11/2002 | Bowman-Annuah | ..... G06F 9/54 709/231 |
| 9,767,114 B2* | 9/2017 | Mahadevan et al. | ........................ G06F 16/176 |
| 10,331,420 B2* | 6/2019 | Nagar et al. | .............. G06F 8/62 |
| 10,621,237 B1* | 4/2020 | Rathnavelu et al. | ........................ G06F 40/106 |
| 2006/0117256 A1* | 6/2006 | Miller et al. | .......... G06F 40/134 715/234 |
| 2020/0159939 A1* | 5/2020 | Sun et al. | ............. G06F 21/604 |

* cited by examiner

*Primary Examiner* — Sun J Lin
(74) *Attorney, Agent, or Firm* — Sterne, Kessler, Goldstein & Fox P.L.L.C.

(57) ABSTRACT

Disclosed herein are system, method, and device embodiments for executing an application program interface (API) plugin for use in conjunction with a vector editing design tool. For example, a method may include: retrieving contextual information related to a plurality of features of a design tool upon initialization of the design tool, the contextual information being stored on a remote server from one or more computing devices; detecting a placement of a first feature from among the plurality of features in a design environment of the design tool; and displaying the contextual information in the design environment in response to detecting the placement of the first feature.

20 Claims, 4 Drawing Sheets

---

200

Retrieving contextual information related to a plurality of features of a design tool upon initialization of the design tool
205

↓

Detecting a placement of a first feature from among the plurality of features in a design environment of the design tool
210

↓

Displaying the contextual information in the design environment in response to detecting the placement of the first feature
215

200

Retrieving contextual information related to a plurality of features of a design tool upon initialization of the design tool
205

Detecting a placement of a first feature from among the plurality of features in a design environment of the design tool
210

Displaying the contextual information in the design environment in response to detecting the placement of the first feature
215

FIG. 2

SYSTEM EDITING PLUGIN

BACKGROUND

Vector editing design tools (e.g., user interface (UI) design kits and design system kits) may be used to facilitate designing a UI for a mobile application or website. UI design kits include a set or collection of layered image files or other graphic files, which allow UI designers to build UIs, and design system kits include a set of principles, constraints, and rules that are used and implemented in code. These vector editing design tools generally contain a plurality of UI features that offer functionality to the UI designers and help the UI designers experiment with their design. That is, the vector editing design tools may include a set of high-quality libraries and toolkits that enable a UI designer to create UIs using hundreds of UI features connected with customizable styles. Existing vector editing design tools, however, are frequently accompanied by static user manuals that may be outdated as updates to the UI design kits and/or design systems are made available.

BRIEF DESCRIPTION OF THE DRAWINGS

The accompanying drawings, which are incorporated herein and form a part of the specification, illustrate embodiments of the present disclosure and, together with the description, further serve to explain the principles of the disclosure and to enable a person skilled in the arts to make and use the embodiments.

FIG. 2 illustrates an example method for executing an application program interface (API) plugin for use in conjunction with a vector editing design tool, according to some embodiments.

Figure 1:
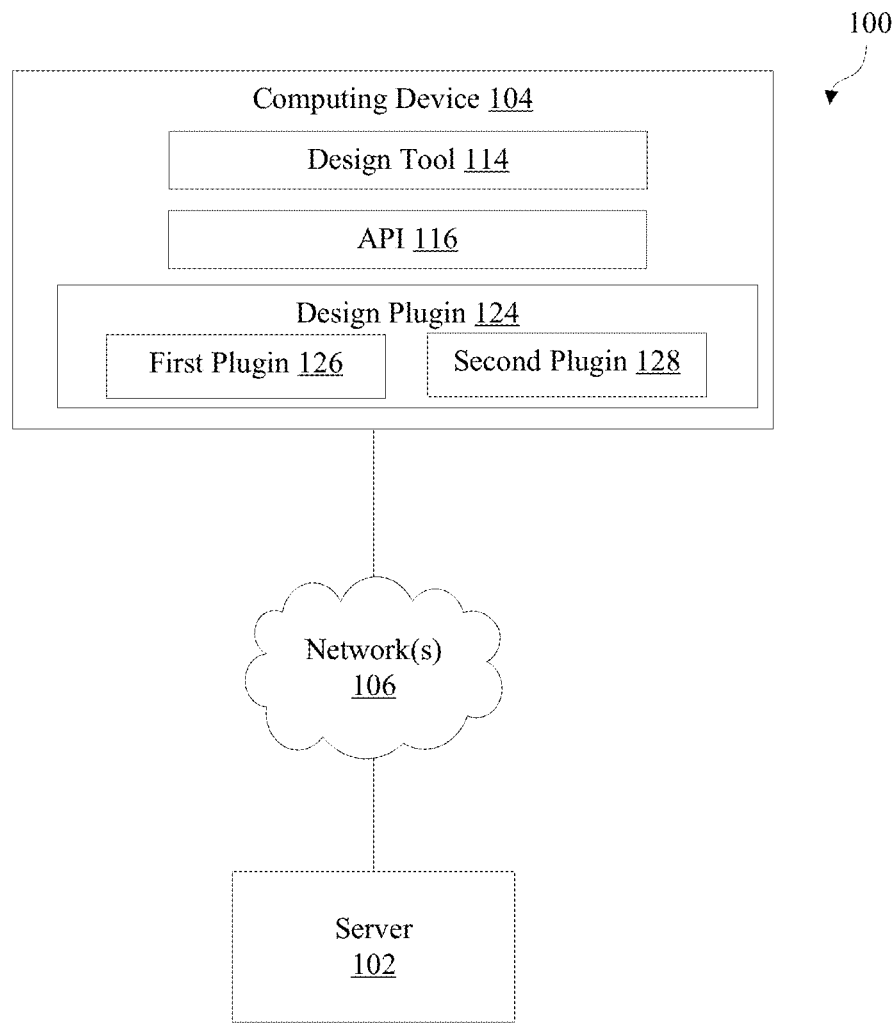
FIG. 1 illustrates is a block diagram of an example framework for executing an application program interface (API) plugin for use in conjunction with a vector editing design tool, according to some embodiments.

The present disclosure will be described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE INVENTION

Provided herein are system, apparatus, device, method and/or computer program product embodiments, and/or combinations and sub-combinations thereof, for executing an application program interface (API) plugin for use in conjunction with a vector editing design tool.

FIG. 1 illustrates a environment for executing an application program interface (API) plugin for use in conjunction with a design system and/or a user interface (UI) design kit. Referring to FIG. 1, the environment 100 may include a server 102 and a computing device 104 in communication with one another over a communication network 106. The communication network 106 may include any or all of a wired and/or wireless private network, personal area network (PAN), Local-Area Network (LAN), a Wide-Area Network (WAN), or the Internet. The server 102 and the computing device 104 may be a computing system, such as the computer system 400 illustrated in FIG. 4 discussed in greater detail below.

The server 102 may be configured to store metadata related to a plurality of UI features of a vector editing design tool (e.g., design tool 114 of the computing device 104). The metadata may include, for example, a respective symbol and contextual information for each of plurality of UI features. The plurality of UI features may include, for example, audio players, avatars, badges, branding, buttons, button groups, carousels, chats, code, colors, comment boxes, containers, data tables, date pickers, drag-and-drop uploaders, drop-down menus, empty states, feeds, fields, folder trees, images, maps, modals, multi-select boxes, notifications, pagination, popovers, progress indicators, ratings, scrims, search fields, sliders, tabs, toggles, tooltips, typography, video players, widgets, or the like. It should be understood by those of ordinary skill in the art that these are merely example UI features and that other UI features are further contemplated in accordance with aspects of the present disclosure.

For each of the plurality of UI features, the contextual information may include, but is not limited to, a title of the UI feature, design guidelines of the UI feature, and a hyperlink to a design document associated with the first feature on an external website. The design guidelines may include information indicating details of a particular feature (e.g., a brief description of the particular feature and its functionality) and/or rules governing how the feature may be used (e.g., a maximum number of times a feature may be used, a size of a feature, a permissible or prohibited location of the feature, restrictions related to using various combinations of features, such as if feature Y is used, then feature X cannot be used, or requirements that certain features be used with one another, such as if feature A is used, then feature B must be used). As should be understood by those of ordinary skill in the arts, the vector editing design tool may be updated, for example, with new UI features, updated versions of the UI features, and/or new rules governing how the plurality of UI features may be used. As such, the contextual information stored on the server 102 may be updated accordingly as the vector editing design tool evolves.

Figure 4:
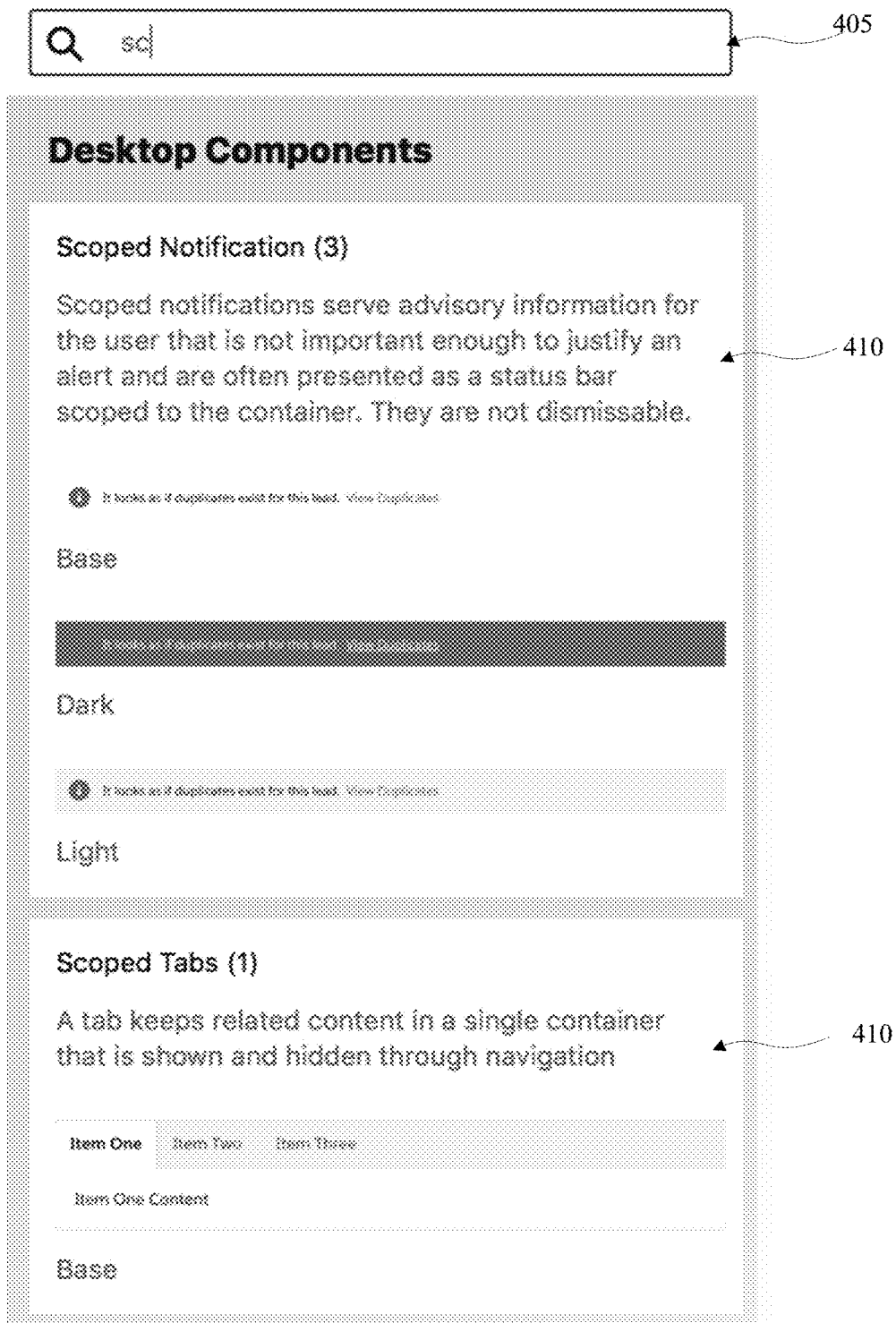
FIG. 4 illustrates an example illustration of contextual information, according to exemplary embodiments of the present disclosure.

The computing device 104 may include a design tool 114, such as a vector editing design tool. As described herein, the vector editing design tool may be a tool used by a user (i.e., a UI designer) to create a UI using any number of UI features from among the plurality of UI features. To achieve this, the design tool 114 may present a canvas for designing the UI, and the user may select an icon associated with a given UI feature, drag-and-drop the selected icon onto the canvas, and modify a style of the UI feature (e.g., adjusting text size, text fonts, text colors, etc. of the features). Additionally, in some embodiments, a user may search for a given UI feature. For example, as illustrated in FIG. 4, a user may use a search bar 405 to search for a UI feature being with the letters "sc." and in response, the contextual information for two different UI features 410, i.e., "scoped notification" and "scoped tabs." As illustrated in FIG. 4, the contextual information for the "scoped notification" and "scoped tabs" may include a brief description of each UI feature.

The computing device 104 may also include an API design plugin 124 having a first plugin 126 and a second plugin 128. In some embodiments, the design plugin 124 may be stored on the computing device 104 and may be a separate program (e.g., a software plugin or extension) that interacts with the design tool 114. For example, upon initialization of the design tool 114 and/or the design plugin 124, the first plugin 126 may query the server 102 for updated metadata related to the plurality of UI features. The updated metadata for the plurality of UI features may then be stored locally on the computing device 104. In response to receiving the updated metadata for the plurality of UI features, the first plugin 126 may request icon information for each of the plurality of UI features.

To provide the icon information to the first plugin 126, the second plugin 128 may import a library of icons associated with the plurality of UI features from an application program interface (API) 116 communicating with the design tool 114, with each UI feature being associated with a corresponding icon in the library of icons. The icons may be, for example, a visual icon (e.g., a .PNG) representing the UI feature. The first plugin 126 may then display the library of icons to the user, and the user may then drag and drop any combination of the displayed icons onto the canvas to design the UI. Additionally, the second plugin 128 may also request symbol information from the design tool 114 via the API 116 in response to detecting the drop event. For example, the symbol information may include a visual representation of the UI feature (i.e., the actual shape, size, color, etc. of the UI feature), rather than just an icon representing the UI feature.

Furthermore, in response to detecting a drop event (i.e., a placement of one of the icons on the canvas), the second plugin 128 may display the contextual information to the user. For example, the contextual information may be displayed in a pop-up window. The second plugin 128 may also monitor the canvas to confirm proper usage of UI features. That is, the first plugin 126 may track the usage of UI features to confirm that the usage is in compliance with the rules governing how the plurality of UI features may be used. For example, the design tool 124 may determine whether a maximum number of times a feature may be used has been exceeded, whether UI features that cannot be used simultaneously have been placed in the UI layout, or whether UI features that are required to be used with one another have been placed in the UI layout. That is, the second plugin 128 may analyze usage of a given to determine whether the usage is in compliance with design guidelines of the feature.

In response to determining that the usage is not in compliance with the design guidelines, the second plugin 128 may generate a notification provided to the user. For example, the notification may include an error message indicating that the design guidelines have been violated. This may be achieved, for example, via a pop-up window. Additionally, the second plugin 128 may take corrective measures to remedy the error. For example, the second plugin 128 may delete a feature that caused that the error. In this way, the second plugin 128 enforces the design guidelines.

In some embodiments, where the design plugin 124 is a separate program, the design tool 114 may prompt the user at the computing device 104 to download and install the design plugin 124. In some embodiments, the design plugin 124 may be implemented in PHP: Hypertext Preprocessor (PHP), Java, Python, JavaScript, Visual Basic, or various other types of programming languages as would be appreciated by a person of ordinary skill in the art. In some embodiments, the design plugin 124 may be a software plugin or extension for viewer the design tool 114. In some embodiments, the design plugin 124 may cause a processor, e.g., a processor 404 as shown in FIG. 4, of the computing device 104 to perform the processes described herein.

FIG. 2 illustrates a method 200 for implementing dynamic customizable animations in a multi-tenant system, according to some embodiments. Method 200 may be performed by processing logic that can comprise hardware (e.g., circuitry, dedicated logic, programmable logic, microcode, etc.), software (e.g., instructions executing on a processing device), or a combination thereof. It is to be appreciated that not all steps may be needed to perform the disclosure provided herein. Further, some of the steps may be performed simultaneously, or in a different order than shown in FIG. 2, as will be understood by a person of ordinary skill in the art(s).

At 205, a computing device, e.g., computing device 104 of FIG. 1, may retrieve contextual information related to a plurality of features of a design tool upon initialization of the design tool. The contextual information may be stored on a remote server, e.g., server 102 of FIG. 1, from the computing device. For each of the plurality of features, the contextual information may include, but is not limited to, a title of the feature, design guidelines of the feature, and a link to the full design documentation on an external website of the feature. The design guidelines may include information indicating details of a particular feature and/or rules governing how the feature may be used.

At 210, the computing device, e.g., computing device 104 of FIG. 1, may detect a placement of a first feature from among the plurality of features in a design environment of the design tool. For example, a canvas and a library of icons associated with the plurality of UI features may be presented to a user for designing the UI, and the user may select an icon associated with a given UI feature from the library of icons, drag-and-drop the selected icon onto the canvas, and modify a style of the UI feature (e.g., adjusting text size, text fonts, text colors, etc. of the features). The icons may be, for example, a visual icon representing the UI feature.

At 215, the computing device, e.g., computing device 104 of FIG. 1, may display the contextual information in the design environment in response to detecting the placement of the first feature. For example, the contextual information may be displayed in a pop-up window.

Figure 3:
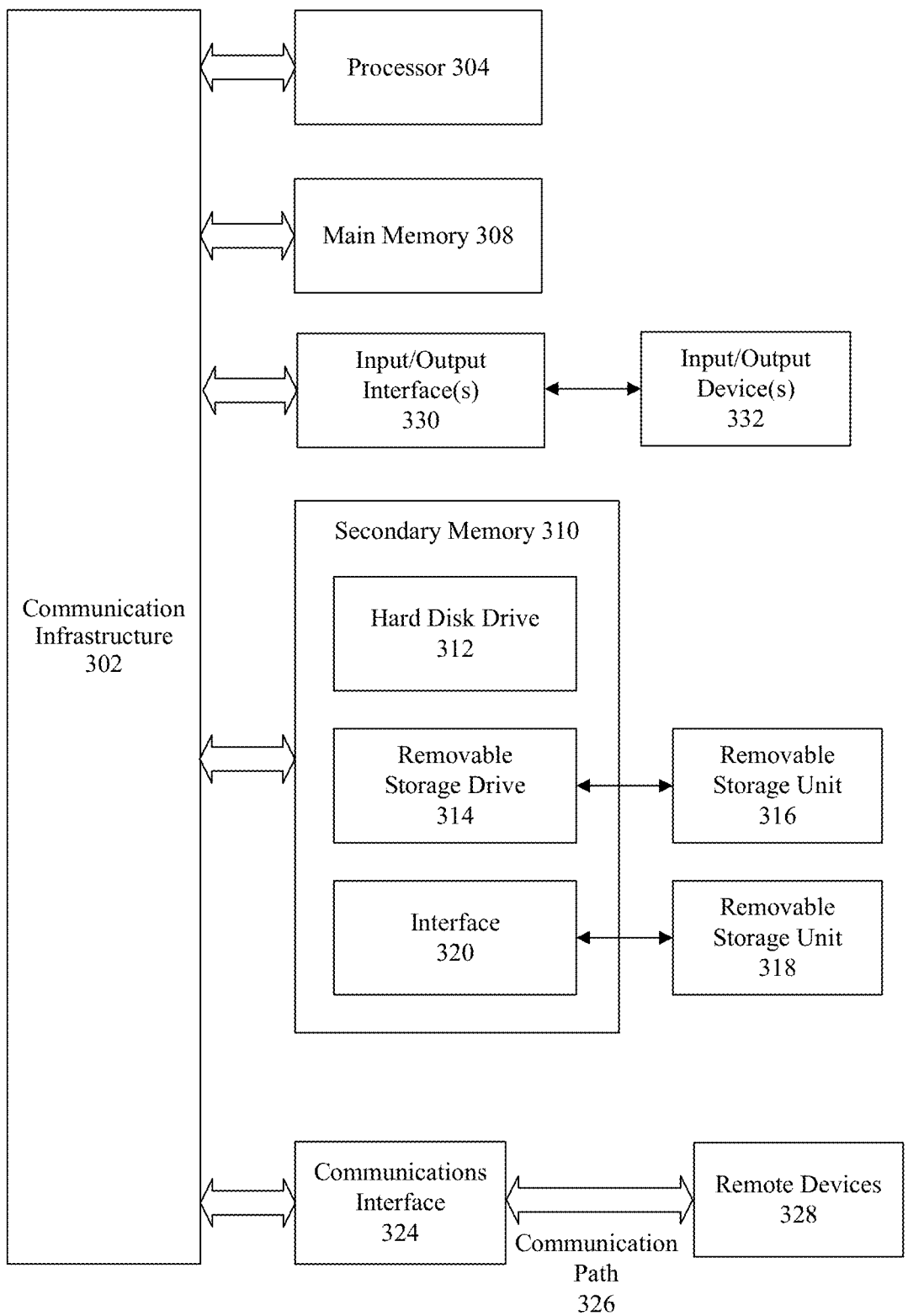
FIG. 3 illustrates a computer system, according to exemplary embodiments of the present disclosure.

FIG. 3 is an example computer system useful for implementing various embodiments. Various embodiments may be implemented, for example, using one or more well-known computer systems, such as computer system 300 shown in FIG. 3. One or more computer systems 300 may be used, for example, to implement any of the embodiments discussed herein, as well as combinations and sub-combinations thereof.

Computer system 300 may include one or more processors (also called central processing units, or CPUs), such as a processor 304. Processor 304 may be connected to a communication infrastructure or bus 306.

Computer system 300 may also include user input/output device(s) 302, such as monitors, keyboards, pointing devices, etc., which may communicate with communication infrastructure or bus 306 through user input/output device(s) 302.

One or more of processors 304 may be a graphics processing unit (GPU). In an embodiment, a GPU may be a processor that is a specialized electronic circuit designed to process mathematically intensive applications. The GPU may have a parallel structure that is efficient for parallel processing of large blocks of data, such as mathematically intensive data common to computer graphics applications, images, videos, etc.

Computer system 300 may also include a main or primary memory 308, such as random access memory (RAM). Main memory 308 may include one or more levels of cache. Main memory 308 may have stored therein control logic (e.g., the API design plugin, other computer software, etc.) and/or data.

Computer system 300 may also include one or more secondary storage devices or memory 310. Secondary memory 310 may include, for example, a hard disk drive 312 and/or a removable storage device or drive 314. Removable storage drive 314 may be a floppy disk drive, a magnetic tape drive, a compact disk drive, an optical storage device, tape backup device, and/or any other storage device/drive.

Removable storage drive 314 may interact with a removable storage unit 318. Removable storage unit 318 may include a computer usable or readable storage device having stored thereon computer software (control logic) and/or data. Removable storage unit 318 may be a floppy disk, magnetic tape, compact disk, DVD, optical storage disk, and/any other computer data storage device. Removable storage drive 314 may read from and/or write to removable storage unit 318.

Secondary memory 310 may include other means, devices, components, instrumentalities or other approaches for allowing computer programs (e.g., the API design plugin) and/or other instructions and/or data to be accessed by computer system 300. Such means, devices, components, instrumentalities or other approaches may include, for example, a removable storage unit 322 and an interface 320. Examples of the removable storage unit 322 and the interface 320 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 300 may further include a communication or network interface 324. Communication interface 324 may enable computer system 300 to communicate and interact with any combination of external devices, external networks, external entities, etc. (individually and collectively referenced by reference number 328). For example, communication interface 324 may allow computer system 300 to communicate with external or remote devices 328 over communications path 326, which may be wired and/or wireless (or a combination thereof), and which may include any combination of LANs, WANs, the Internet, etc. Control logic and/or data may be transmitted to and from computer system 300 via communication path 326.

Computer system 300 may also be any of a personal digital assistant (PDA), desktop workstation, laptop or notebook computer, netbook, tablet, smart phone, smart watch or other wearable, appliance, part of the Internet-of-Things, and/or embedded system, to name a few non-limiting examples, or any combination thereof.

Computer system 300 may be a client or server, accessing or hosting any applications and/or data through any delivery paradigm, including but not limited to remote or distributed cloud computing solutions; local or on-premises software ("on-premise" cloud-based solutions); "as a service" models (e.g., content as a service (CaaS), digital content as a service (DCaaS), software as a service (SaaS), managed software as a service (MSaaS), platform as a service (PaaS), desktop as a service (DaaS), framework as a service (FaaS), backend as a service (BaaS), mobile backend as a service (MBaaS), infrastructure as a service (IaaS), etc.); and/or a hybrid model including any combination of the foregoing examples or other services or delivery paradigms.

Any applicable data structures, file formats, and schemas in computer system 300 may be derived from standards including but not limited to JavaScript Object Notation (JSON), Extensible Markup Language (XML), Yet Another Markup Language (YAML), Extensible Hypertext Markup Language (XHTML), Wireless Markup Language (WML), MessagePack, XML User Interface Language (XUL), or any other functionally similar representations alone or in combination. Alternatively, proprietary data structures, formats or schemas may be used, either exclusively or in combination with known or open standards.

In some embodiments, a tangible, non-transitory apparatus or article of manufacture comprising a tangible, non-transitory computer useable or readable medium having control logic (software) stored thereon may also be referred to herein as a computer program product or program storage device. This includes, but is not limited to, computer system 300, main memory 308, secondary memory 310, and removable storage units 318 and 322, as well as tangible articles of manufacture embodying any combination of the foregoing. Such control logic, when executed by one or more data processing devices (such as computer system 300), may cause such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 3. In particular, embodiments can operate with software, hardware, and/or operating system implementations other than those described herein.

It is to be appreciated that the Detailed Description section, and not any other section, is intended to be used to interpret the claims. Other sections can set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed is:

1. A computer-implemented method, comprising:
 retrieving, by one or more computing devices, contextual information related to a plurality of features of a design tool upon initialization of the design tool, the contextual information being stored on a remote server from the one or more computing devices;
 detecting, by the one or more computing devices, a placement of a first feature from among the plurality of features in a design environment of the design tool; and
 displaying, by the one or more computing devices, the contextual information in the design environment in response to detecting the placement of the first feature.

2. The method of claim 1, wherein the contextual information comprises a description and usage guidelines for each feature of the plurality of features.

3. The method of claim 2, further comprising analyzing a usage of the first feature to determine whether the usage is in compliance with design guidelines of the first feature.

4. The method of claim 3, further comprising generating a notification in response to determining that the usage is not in compliance with the design guidelines.

5. The method of claim 3, further comprising deleting the first feature in response to determining that the usage is not in compliance with the design guidelines.

6. The method of claim 1, wherein the contextual information includes a hyperlink to a design document associated with the first feature on an external website.

7. The method of claim 1, wherein the displaying the contextual information comprises displaying the contextual information in a pop-up window.

8. A system comprising:
 a memory; and
 a processor coupled to the memory and configured to:
  retrieve contextual information related to a plurality of features of a design tool upon initialization of the design tool, the contextual information being stored on a remote server from the system;
  detect a placement of a first feature from among the plurality of features in a design environment of the design tool; and
  display the contextual information in the design environment in response to detecting the placement of the first feature.

9. The system of claim 8, wherein the contextual information comprises a description and usage guidelines for each feature of the plurality of features.

10. The system of claim 9, wherein the processor is further configured to analyze a usage of the first feature to determine whether the usage is in compliance with design guidelines of the first feature.

11. The system of claim 10, wherein the processor is further configured to generate a notification in response to determining that the usage is not in compliance with the design guidelines.

12. The system of claim 10, wherein the processor is further configured to delete the first feature in response to determining that the usage is not in compliance with the design guidelines.

13. The system of claim 8, wherein the contextual information includes a hyperlink to a design document associated with the first feature on an external website.

14. The system of claim 8, wherein, to display the contextual information, the processor is further configured to display the contextual information in a pop-up window.

15. A non-transitory computer-readable device having instructions stored thereon that, when executed by at least one computing device, cause the at least one computing device to perform operations comprising:
 retrieving contextual information related to a plurality of features of a design tool upon initialization of the design tool, the contextual information being stored on a remote server from the one or more computing devices;
 detecting a placement of a first feature from among the plurality of features in a design environment of the design tool; and
 displaying the contextual information in the design environment in response to detecting the placement of the first feature.

16. The non-transitory computer-readable device of claim 15, wherein the contextual information comprises a description and usage guidelines for each feature of the plurality of features.

17. The non-transitory computer-readable device of claim 16, further comprising analyzing a usage of the first feature to determine whether the usage is in compliance with design guidelines of the first feature.

18. The non-transitory computer-readable device of claim 17, further comprising generating a notification in response to determining that the usage is not in compliance with the design guidelines.

19. The non-transitory computer-readable device of claim 15, wherein the contextual information includes a hyperlink to a design document associated with the first feature on an external website.

20. The non-transitory computer-readable device of claim 15, wherein the displaying the contextual information comprises displaying the contextual information in a pop-up window.

* * * * *

UNITED STATES PATENT AND TRADEMARK OFFICE
CERTIFICATE OF CORRECTION

PATENT NO. : 10,997,341 B1  
APPLICATION NO. : 16/711956  
DATED : May 4, 2021  
INVENTOR(S) : Alan Weibel et al.

Page 1 of 1

It is certified that error appears in the above-identified patent and that said Letters Patent is hereby corrected as shown below:

On the Title Page

Item (54), and in the Specification, Column 1, Line 1, Title, "SYSTEM EDITING PLUGIN" should read --DESIGN SYSTEM EDITING PLUGIN--.

Signed and Sealed this  
Second Day of November, 2021

Drew Hirshfeld  
*Performing the Functions and Duties of the*  
*Under Secretary of Commerce for Intellectual Property and*  
*Director of the United States Patent and Trademark Office*